US009519744B1

(12) United States Patent
Migatz et al.

(10) Patent No.: US 9,519,744 B1
(45) Date of Patent: Dec. 13, 2016

(54) MERGING OF STORAGE ELEMENTS ON MULTI-CYCLE SIGNAL DISTRIBUTION TREES INTO MULTI-BIT CELLS

(71) Applicant: International Business Machines Corporation, Armonk, NY (US)

(72) Inventors: William R. Migatz, Wappingers Falls, NY (US); Shyam Ramji, Lagrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/960,812

(22) Filed: Dec. 7, 2015

(51) Int. Cl.
*G06F 17/50* (2006.01)

(52) U.S. Cl.
CPC ................. *G06F 17/5072* (2013.01)

(58) Field of Classification Search
CPC ...................................... G06F 17/50
USPC ...................................... 716/119
See application file for complete search history.

(56) References Cited

U.S. PATENT DOCUMENTS

| | | | |
|---|---|---|---|
| 6,800,882 B2 | 10/2004 | Dillon et al. | |
| 6,828,838 B1 | 12/2004 | Anshumali et al. | |
| 7,224,421 B1 | 5/2007 | Takeda et al. | |
| 7,882,385 B2 | 2/2011 | Arnold et al. | |
| 8,104,014 B2 | 1/2012 | Puri et al. | |
| 8,291,201 B2 | 10/2012 | Schwinn et al. | |
| 8,555,227 B2 | 10/2013 | Mallem et al. | |
| 8,633,753 B2 | 1/2014 | Chae | |
| 9,087,568 B1 | 7/2015 | Ware | |
| 2006/0136854 A1 | 6/2006 | Arp et al. | |
| 2007/0245281 A1* | 10/2007 | Riepe | G06F 17/5072 716/102 |
| 2012/0025885 A1 | 2/2012 | Lavery et al. | |
| 2013/0194016 A1 | 8/2013 | Wimer | |
| 2013/0326451 A1 | 12/2013 | Cho et al. | |

OTHER PUBLICATIONS

Ashna V R et al., "Design of low power clocking system using merged flip-flop technique", 2013 International Conference on Computer Communication and Informatics (ICCCI-2013), Jan. 4-6, 2013, pp. 1-6.
Chang et al., "Novel Pulsed-Latch Replacement Based on Time Borrowing and Spiral Clustering", National Chiao Tung University, IRIS Lab, PL-ISPD'12, 2012, pp. 1-50.

(Continued)

*Primary Examiner* — Thuan Do
(74) *Attorney, Agent, or Firm* — Cantor Colburn LLP; Feb R. Cabrasawan

(57) ABSTRACT

A method, system, and computer program product to merge storage elements on multi-cycle signal distribution trees into multi-bit cells of an integrated circuit include determining initial placement regions and initial placement locations for a plurality of storage elements arranged in two or more levels on the one or more trees, determining potential merge storage elements among the plurality of storage elements, and merging one or more pairs of the potential merge storage elements across the one or more trees into the multi-bit cells based on satisfying an additional condition. The two or more levels of each of the one or more trees includes a root level closest to a tree source of the respective one or more trees and a leaf level closest to a tree sink of the respective one or more trees.

20 Claims, 10 Drawing Sheets

(56) References Cited

OTHER PUBLICATIONS

Jiang et al., "INTEGRA: Fast Multibit Flip-Flop Clustering for Clock Power Saving", IEEE Transactions on Computer-Aided Design of Integrated Circuits and Systems, vol. 31, No. 2, Feb. 2012, pp. 192-204.
Lin et al., "Post-Placement Power Optimization with Multi-Bit Flip-Flops", IEEE Transactions on Computer-Aided Design of Integrated Circuits and Systems, vol. 30, No. 12, Dec. 2011, pp. 1870-1882.
Pokala et al., "Physical Synthesis for Performance Optimization", Proc. IEEE Int. ASIC Conf. Exhibit., Sep. 1992, pp. 34-37.
Uemura et al., "Mitigating Multi-Bit-Upset With Well-Slits in 28 nm Multi-Bit-Latch", IEEE Transactions on Nuclear Science, vol. 60, No. 6, Dec. 2013, pp. 4362-4367.
Wang et al., "Power-Driven Flip-Flop Merging and Relocation", IEEE Transactions on Computer-Aided Design of Integrated Circuits and Systems, vol. 31, No. 2, Feb. 2012, pp. 180-191.
Yan et al., "Construction of Constrained Multi-Bit Flip-Flops for Clock Power Reduction", Proc. IEEE Int. Conf. Green Circuits Syst., Jun. 2010, pp. 675-678.

* cited by examiner

US 9,519,744 B1

MERGING OF STORAGE ELEMENTS ON MULTI-CYCLE SIGNAL DISTRIBUTION TREES INTO MULTI-BIT CELLS

BACKGROUND

The present invention relates to integrated circuit design, and more specifically, to merging of storage elements on multi-cycle signal distribution trees into multi-bit cells.

An integrated circuit is comprised of a number of components, such as storage elements (e.g., latches), that are driven by control signals to perform the necessary operations. As the size of an integrated circuit (chip) increases, the distribution of the control signals across the chip may take multiple clock cycles. According to one prior approach, some of the cells (e.g., latches) of a data path are merged into multi-bit latches. These multi-bit cells have a common clock and control lines but individual data input and output pins for each cell. The common clock pin, with the potential internal buffering, reduces the load on the clock distribution network. In addition, the reduced number of pins driven by the clock network due to two or more latches in a common cell reduces the required wiring. As a result, power consumption by the clock distribution network is also reduced.

SUMMARY

Embodiments include a method, system, and computer program product for merging storage elements on one or more multi-cycle signal distribution trees into multi-bit cells of an integrated circuit. Aspects include determining, using a processor, initial placement regions and initial placement locations for a plurality of storage elements arranged in two or more levels on the one or more trees, the two or more levels of each of the one or more trees including a root level closest to a tree source of the respective one or more trees and a leaf level closest to a tree sink of the respective one or more trees; determining potential merge storage elements among the plurality of storage elements; and merging the potential merge storage elements across the one or more trees into the multi-bit cells based on satisfying an additional condition.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, latches within a data path have been merged to reduce power consumption. Latch trees (like buffer trees) have been used that employ a latch at each stage, with connections between the latches being buffered. However, the connection between these cells (latches) and the clock distribution network uses a significant amount of power. Embodiments of the systems and methods detailed herein relate to merging latches of a tree into multi-bit latches to reduce power consumption. This reduction in power consumption results in reduced heat generation and improves the overall chip design, because the clock distribution network and the devices that it drives (e.g., latches, registers) are among the highest power consumers on the chip. The embodiments herein relate to merging cells within and across trees as part of the tree construction. The trees are processed from leaves to roots to determine network connections without actually placing components. The trees are then processed from roots to leaves, with all the trees being processed in parallel, to determine placement and merging. The previous merging of latches within a data path assumes that the logic between the latches is not movable. This assumption overly constrains the problem in the context of latch trees. Because latches may only be merged if they can be moved to a common location, maximizing the size of the placement areas of latches, as discussed below, facilitates maximizing the number of merged latches. Although latches are specifically discussed below for explanatory purposes, the embodiments detailed herein apply to other types of storage elements, as well.

Figure 1:
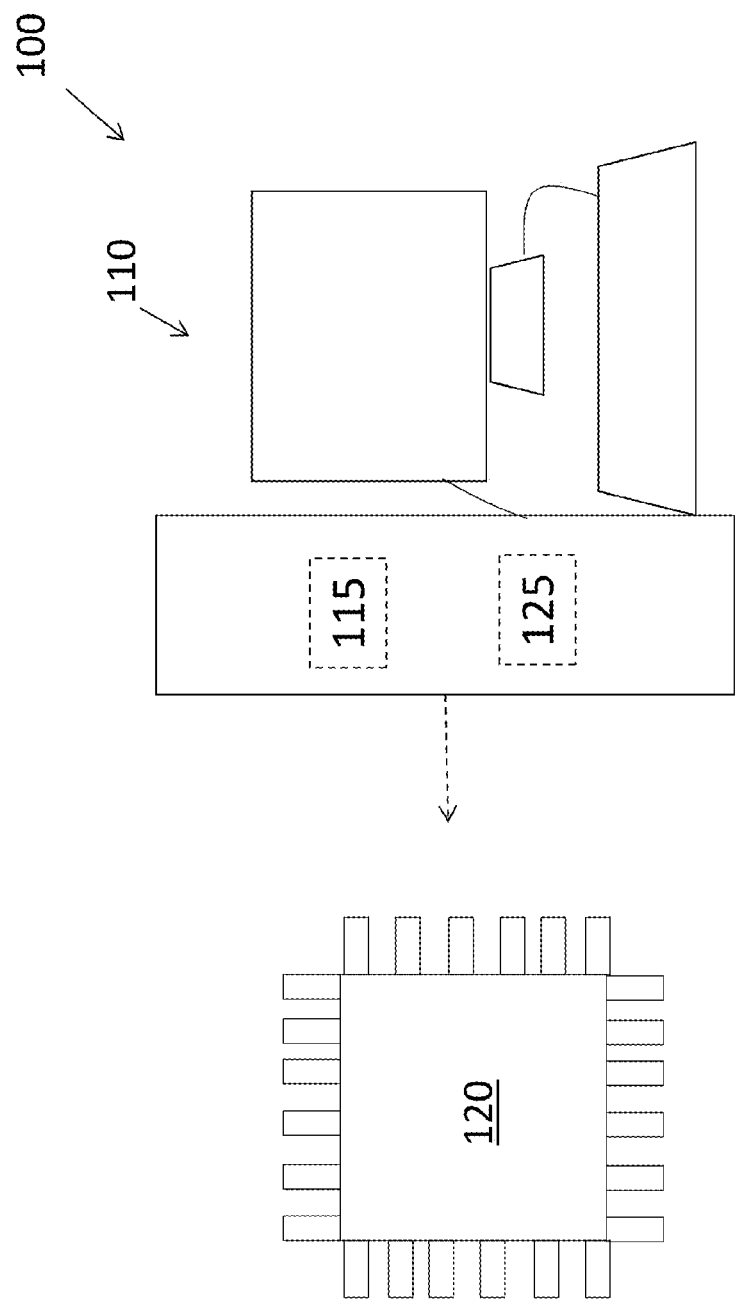
FIG. 1 is a block diagram of a system according to embodiments of the invention.

FIG. 1 is a block diagram of a system 100 according to embodiments of the invention. The system 100 includes a processing system 110 used to design an integrated circuit and the resulting physical implementation of the integrated circuit 120. The system 100 includes additional known components such as, for example, an input and output interface. The processing system 110 includes one or more memory devices 115 and one or more processors 125. Multiple of the processors 125 may be used in the multi-bit cell generation detailed below. The memory device 115 stores instructions implemented by the processor 125. As further discussed below, these instructions include processes used to perform the multi-bit cell generation. According to the embodiments detailed below, the memory device 115 may additionally store the information generated from the processes detailed in FIG. 2 below.

Figure 2:
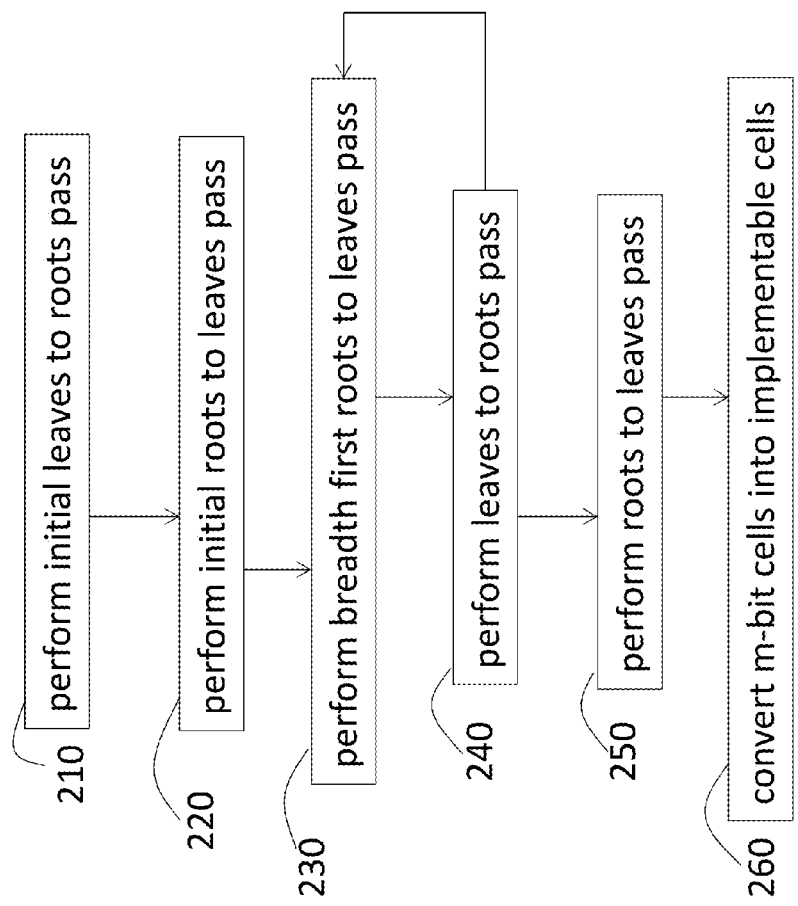
FIG. 2 is a process flow of a method of merging storage elements on multi-cycle signal distribution trees into multi-bit cells according to embodiments.

FIG. 2 is a process flow of a method of merging storage elements on multi-cycle signal distribution trees into multi-bit cells according to embodiments. Each of the processes is additionally detailed and refers to the tree structure for the latches (cells). The sources are referred to as roots of the tree structure. The sources fan out to ultimately lead to sinks. The latches along this path and the sinks are referred to as leaves of the tree structure. At block 210, performing an initial leaves to roots pass includes determining valid single bit placement regions (shapes). Performing an initial roots to leaves pass, at block 220, includes determining preliminary single bit placement locations. At block 230, performing a breadth first roots to leaves pass includes identifying mergers and limiting placement regions. Performing a leaves to roots pass, at block 240, includes updating placement regions. As FIG. 2 indicates and as further discussed below, the processes 230, 240 may be performed iteratively. At block 250, performing a roots to leaves pass includes placing all merged and un-merged latches. Converting m-bit cells into implementable cells, at block 260.

Figure 3:
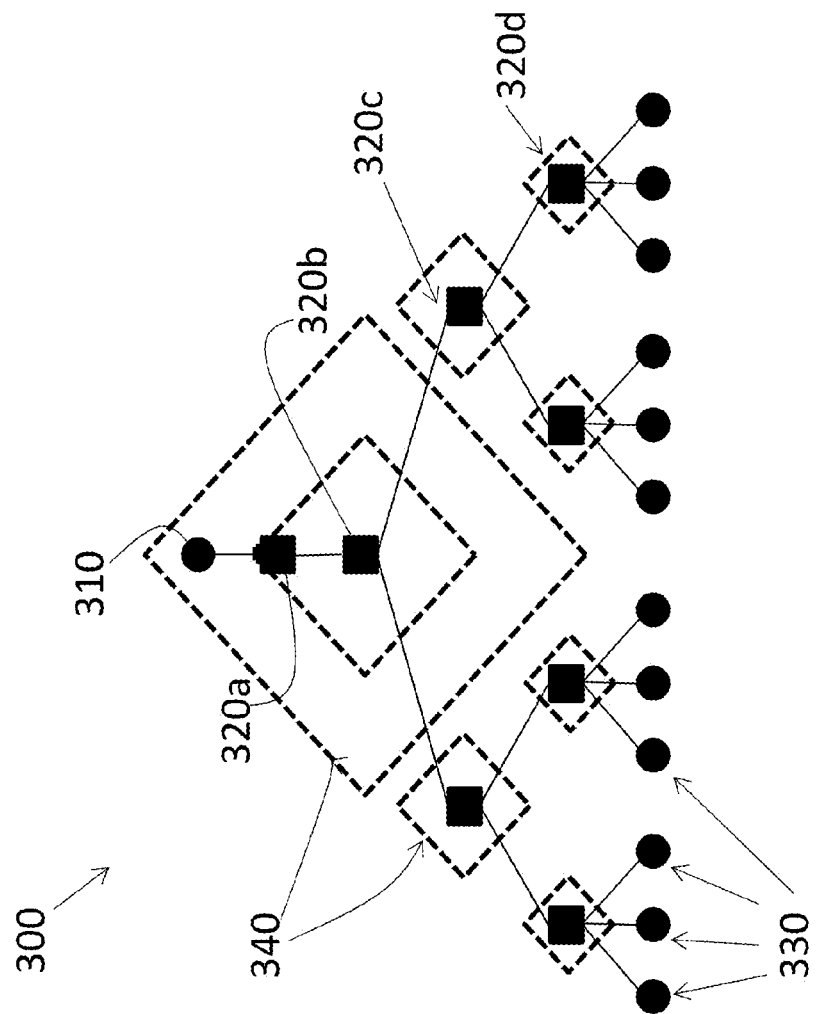
FIG. 3 illustrates an exemplary result of the process of performing an initial leaves to roots pass according to embodiments.

FIG. 3 illustrates the process of performing an initial leaves to roots pass (block 210, FIG. 2) according to embodiments. A process that has previously been used to place clocked elements (e.g., buffer) in a clock tree may be used to place latches 320 in the initial tree structure, but the embodiments herein extend this process, as discussed below, to merge latches into multi-bit cells. The initial tree structure may be built by alternate processes, as well. FIG. 3 shows an exemplary tree 300 structure with one source 310 (root), latches 320 at different levels, and sinks 330 (leaves). To be clear, at each given level, a latch may be a source or a sink (e.g., latches 320*c* are sinks for source latch 320*b*) and will be referred to as local sources or sinks for clarity, but the source 310 is the network source, and sinks 330 are network sinks. The sinks 330 have fixed locations, but each of the latches 320 have a region 340 within which they may be placed. As FIG. 3 indicates, the size of the region 340 tends to increase for every latch 320 level from the sinks 330 to the source 310, and this growth in the region 340 size provides flexibility in merging multi-bit cells, as further discussed below. The regions 340 in which each of the latches 320 may be placed are shown as diamonds (Manhattan circles). The regions 340 are computed based only on the locations of the sinks 330 of the network and are, therefore, computed in a leaves to roots fashion.

Any number of criteria may be used to calculate the regions 340. In generating the tree 300 of latches 320, primary concerns are slew (time duration for a voltage value at the respective latch to increase from a lower to a higher threshold value (e.g., 10% to 90% of the maximum voltage)) and cycle time (total time for latch process). Specifically, networks on the tree 300 must have slews within predefined limits and latencies that are less than the cycle time after being buffered. Thus, calculating the distance that a signal can travel while meeting the slew and latency constraints provides the radius of the regions 340 at the level of latches 320*d*. Above that level, the shapes of the regions 340 need not be diamonds (as shown) but, instead, depend on the shapes of the local sink placement regions (e.g., shape of regions around latches 320*c* depends on the shape of the regions around latches 320*d*, which are the local sinks of latches 320*c*) and their relative locations. The maximum distance constraint (based on slew and cycle time) will apply between each network source 310 and all of its sinks (320*a* in the example shown in FIG. 3). The distance limit (between every source including local sources and every sink including local sinks) and placement regions of the local sinks (latches 320*b-d*) affect the local source (next level latches 320*a-c*) region 340. Thus, the size of each local source (latches 320*a-c*) region 340 may be maximized based on a on the assumption that each local sink (latches 320*b-d*) has the ability to move to the ideal location within its placement region 340 so as to allow the source the maximum amount of movement in forming its region. This can be viewed as the sinks "following" the source if it were to be placed a particular location on the boundary of its region. This is discussed with reference to block 220 (roots to leaves pass) and results in the initial placement locations for the latches 320*a-d* within their respective regions 340.

The regions 340 are not meaningful until they are modified to take into account the physical representation of the chip. The physical representation includes blocked areas 410 (discussed further below with reference to FIG. 4) in which latches 320 may not be placed for various reasons (e.g., other components have been placed in the blocked areas 410). Thus, the regions 340 would only maintain their shapes, as shown in FIG. 3, if there were no blocked areas 410 that intersected with them. However, in reality, regions 340 at each level are intersected with blocked areas 410 (as discussed below) and modified to shapes 420 (FIG. 2) before the initial leaves to roots process progressed to the next level. That is, for example, once the regions 340 for the latches 320*d* were determined as discussed above, those regions 340 would be intersected with blocked areas 410 as discussed below. The determining of regions 340 and then shapes 420 would then be performed for latches 320*c*. The shapes 420 for latches 320*d* would influence the shapes 420 for latches 320*c*.

Figure 4:
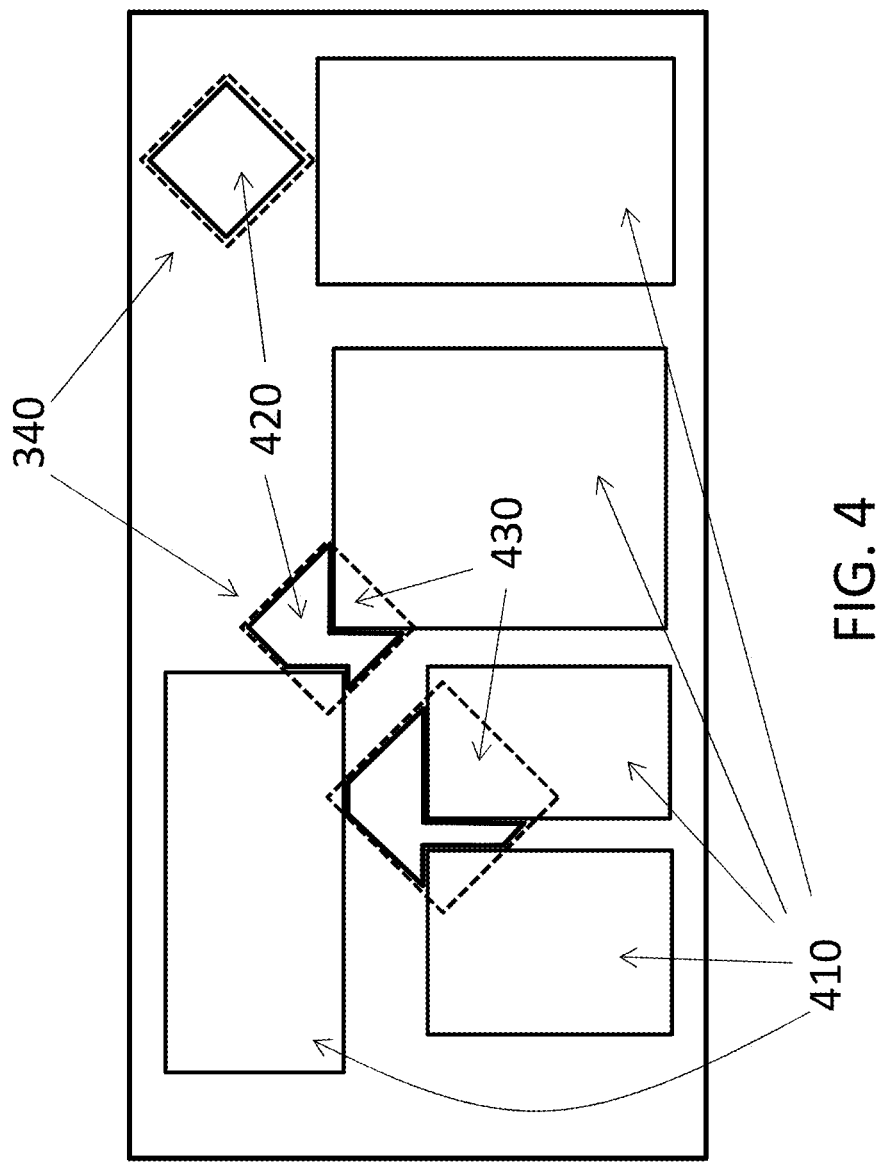
FIG. 4 illustrates the additional aspects of the process of performing an initial leaves to roots pass according to embodiments.

FIG. 4 illustrates the additional aspects of the process of performing an initial leaves to roots pass (block 210, FIG. 2) according to embodiments. Exemplary regions 340 are shown along with blocked areas 410. The overlapping areas 430 (overlap or region 340 with blocked area 410) are subtracted from the regions 340 to provide the shapes 420 that represent the realistic areas where latches 320 may be placed. As noted above, determining the intersection between the regions 340 and blocked areas 410 (the determination of the shape 420 from the region 340) must be done at each level of latches 320 prior to calculating the region 340 for the next level of latches (going from sinks 330 to source 310) according to embodiments.

Figure 5:
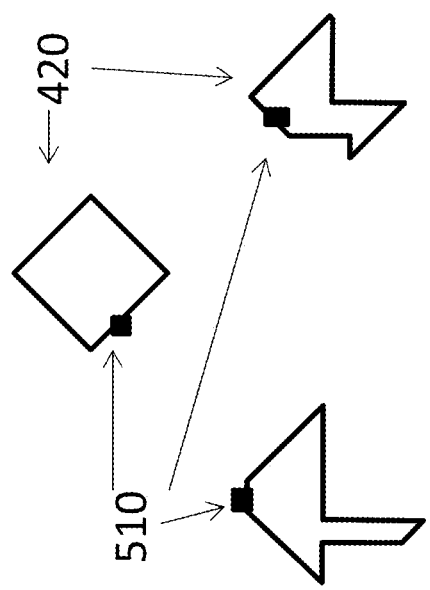
FIG. 5 illustrates an exemplary result of the process of performing an initial roots to leaves pass according to embodiments.

FIG. 5 illustrates an exemplary result of the process of performing an initial roots to leaves pass (block 220, FIG. 2) according to embodiments. Exemplary shapes 420 are shown, which result from the initial leaves to roots pass (block 210). An initial placement 510 for latches 320 on the tree 300 is determined. This initial placement 510 is within the shape 420 for the given latch 320. As discussed above, the shape 420 results from an intersection of the region 340 determined for the given latch 320 (by the leaves to root pass) with blocked areas 410 indicating areas of the chip that are already otherwise designated. To be clear, the processes discussed thus far may be performed independently, in parallel, on each of any number of trees 300 of latches 320. However, it is possible for two or more trees 300 to intersect at multi-input cells (e.g., when certain non-latches are on the trees 300). Such an intersection would impart an order dependency such that one tree 300 may be designated as the primary tree 300 that is processed first. A secondary tree 300 would be processed from the point of intersection up to its root 310. As discussed below, additional processes are used to merge latches within and across trees 300.

Performing a breadth first roots to leaves pass (block 230, FIG. 2) involves processing and post-processing as detailed below. The processing involves one level of latches 320 at a time, starting at the level closest to the root (source 310) and moving toward the leaves (sinks 330). The breadth first roots to leaves pass is done for each tree 300 of latches 320. Thus, because some trees 300 may have more levels of latches 320 than others, work on some trees 300 may continue after breadth first processing of the other trees 300 is completed. All the trees 300 are aligned such that the first level is the level of latches 320 closest to the source 310.

This first level may include a single latch 320 (e.g., latch 320a in FIG. 3). The processing and post-processing at each level begins with identifying the local source 605 (e.g., source 310 is also the local source for the first level latch 320 shown in FIG. 3). When the local source 605 (FIG. 6) does not have a placement shape 420 associated with it (e.g., source 310 does not have a region 340 and subsequent shape 420 associated with it), a diamond with a radius of the source to sink distance limit (discussed above) is created centered around the local source to generate the shape 610. If the local source 605 does have a placement shape 420 (e.g., local source 320a for the next level with latch 320b), this shape 420 is expanded by the source to sink distance in a Manhattan expansion to generate the expanded shape 610. A Manhattan expansion refers to an increase of the size of a shape 420 by a fixed distance as measured by rectilinear distance (e.g., Manhattan expansion of a diamond is a bigger diamond but Manhattan expansion of a rectangle is an octagonal shape). The application of the (expanded) local source shape 610 is discussed further below with reference to FIG. 6.

Figure 6:
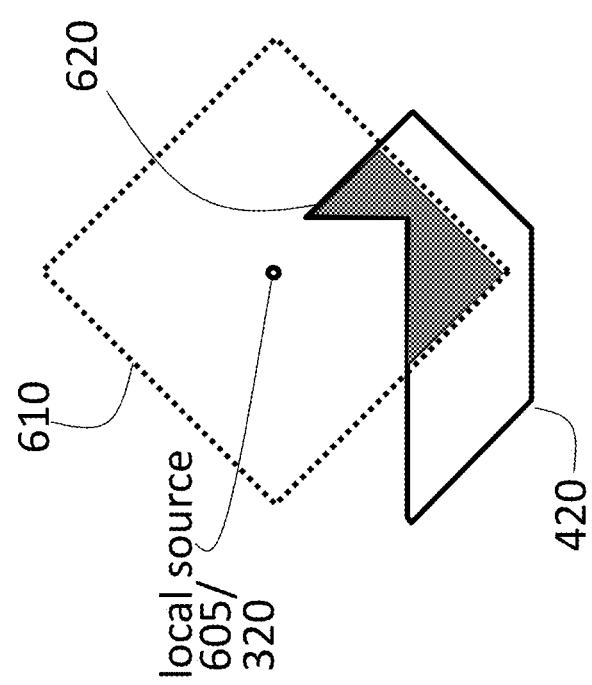
FIG. 6 illustrates a process associated with a breadth first roots to leaves pass according to embodiments.

FIG. 6 illustrates a process associated with a breadth first roots to leaves pass (block 230, FIG. 2) according to embodiments. The expanded source shape 610 is intersected with a placement shape 420 of the local sink (the latch 320 at the currently processed level). Although only one local sink is shown in FIG. 6 for explanatory purposes, it should be clear that the expanded source shape 610 is intersected with the placement shape 420 of each of its local sinks. The result of the intersection becomes the placement region 620 of the local sink (latch 320 of the currently processed level). The placement region 620 is added to a list of regions and their associated latches 320 for use in the post-processing detailed below. At this processing stage, if there is a single fan-out (local source 605 goes to only one local sink (i.e., current level latch 320), as shown in FIG. 6) and if the expanded source shape 610 and local sink placement shape 420 overlap, then the two latches 320 (the local source 605 and the local sink) are marked to be merged, and their placement regions (610 and 420) are updated to be the intersection placement region 620. If the local source 605 is the source 310 (the root) that drives the root level latch 320, then a merger cannot take place, but the sink placement region 420 is updated to be stored as the intersection placement region 620. Thus, every latch 320 is associated with an intersection placement region 620 after the breadth first roots to leaves process is completed for each level of the tree 300.

The post-processing that is part of the breadth first roots to leaves pass is now detailed. The post-processing is associated with three criteria (or conditions), each of which indicates a potential for merger (an addition of an edge to the graph discussed below and shown in FIG. 8). Each of the three criteria is detailed below. The processing described above and the post-processing discussed here are both performed for a given level before the next level is addressed. Different trees 300 are processed in parallel. The list of regions (620) and associated latches 320 is used to build a map. The map is used to identify areas of overlap among the regions (620), because every area of overlap (non-zero intersection) represents a potential for merger of the corresponding latches 320 into a multi-bit latch. According to embodiments, the map is a data structure that is suitable to efficiently identify intersections. For example, the map may be represented by a known kd-tree structure. The map is used to create a graph (FIG. 8) in which latches 320 are represented by vertices connected by edges if their regions (620) overlap. However, simple overlap of the regions (620) is not sufficient to guarantee that merger of the corresponding latches 320 is possible. That is, the overlap is a necessary but not sufficient condition to merge. This is because even though two latches 320 may have overlapping regions (620), they may each be pulled to different locations in their respective placement regions 620 by their respective local sources 605.

Thus, an edge is added to the graph only if one or more additional conditions are met. One such condition is that the local sources 605 of the latches 320 have themselves been merged. In this case, the latches 320 will be pulled to the same location. Another condition that would be sufficient to add an edge between latches to the graph is when the sources 310 of two trees 300 are very close, according to a predefined threshold, such that their corresponding local sink latches 320 are essentially pulled in the same direction. A third condition, discussed below, is referred to as reduced merging.

Figure 7:
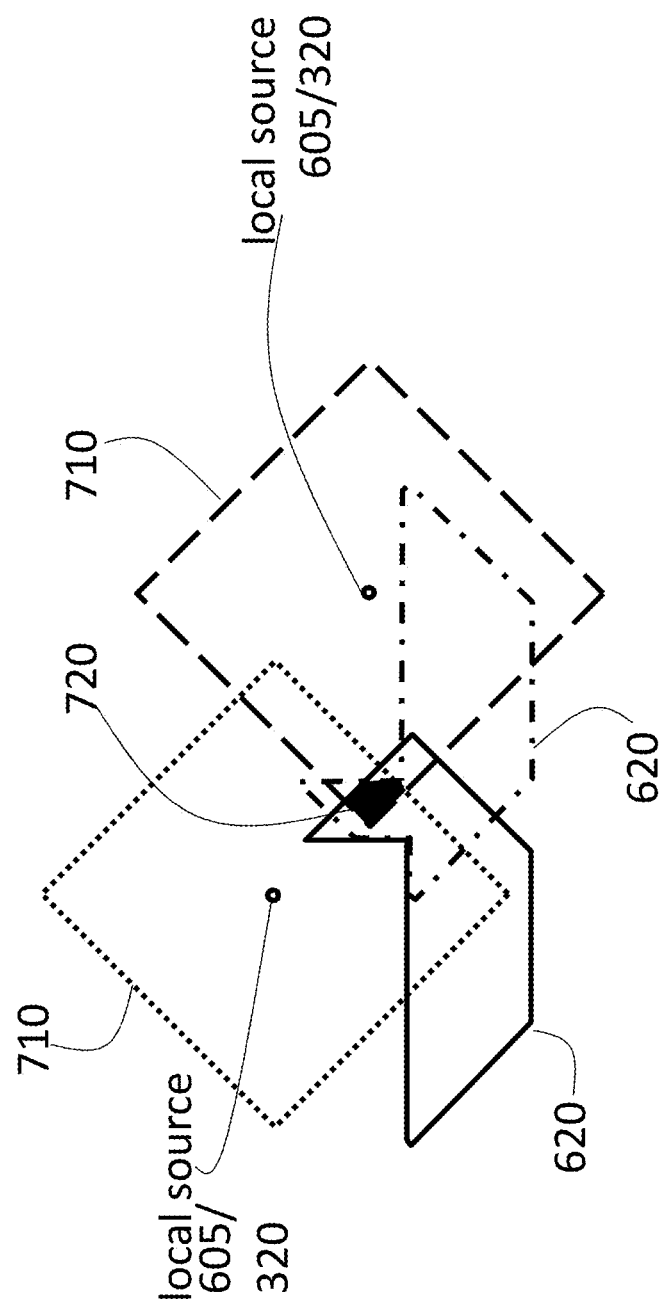
FIG. 7 illustrates additional merging conditions as part of the breadth first roots to leaves process according to embodiments.
Figure 8:
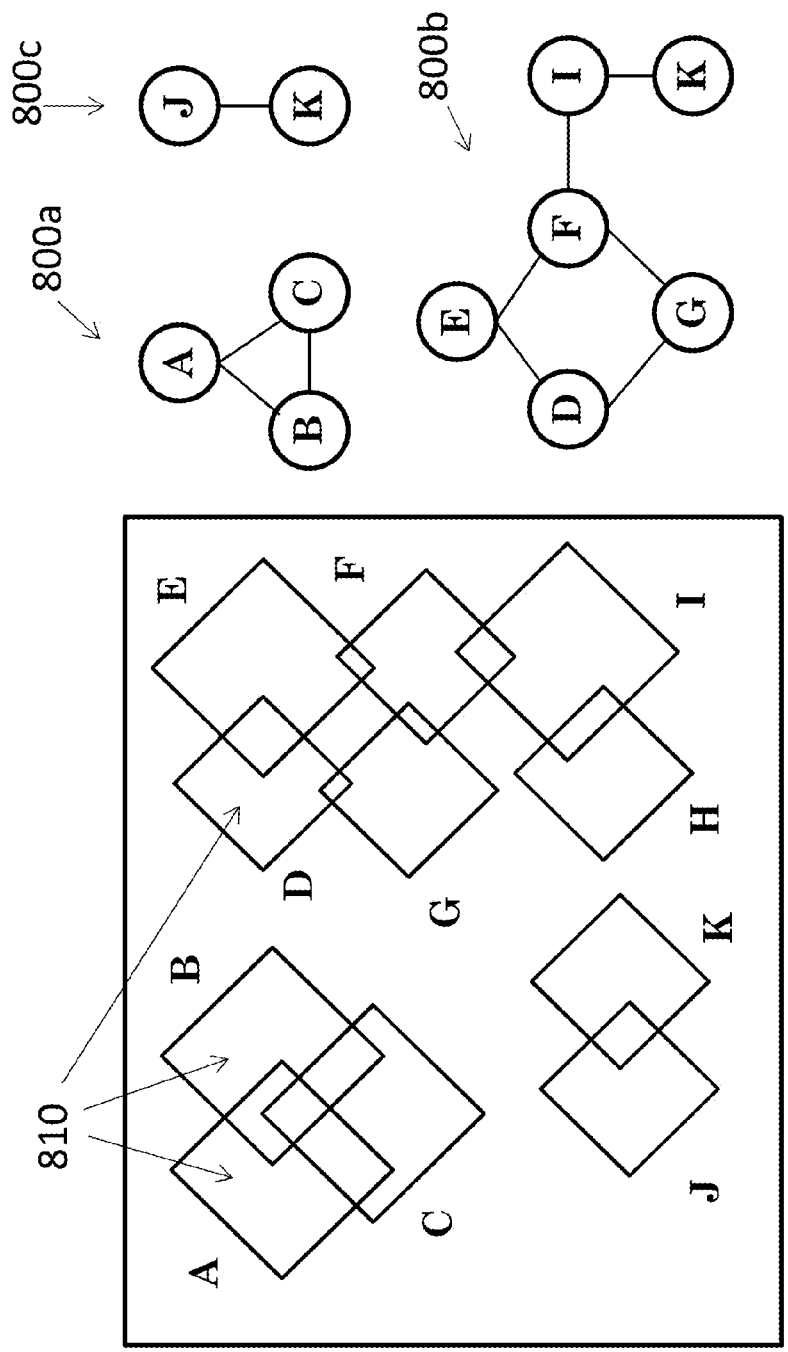
FIG. 8 shows exemplary overlapping placement regions and the resulting exemplary graphs according to embodiments.

FIG. 7 illustrates an additional merging condition as part of the breadth first roots to leaves process (block 230, FIG. 2) according to embodiments. For example, the initial location of the parent (local source) latches 320 are used and diamonds 710 with a radius given by the local source latch 320 to sink latch 320 distance limit are drawn around the local source latches 605. Two such local sources 605 are shown in FIG. 7. If the intersection of both the diamonds 710 associated with both the local sources 605 intersect with the sink placement regions 620 (of the latches 320 at the level being processed) and result in a non-empty shape area 720, then the (sinks) latches 320 may be merged and, thus, an edge between the two sink latches 320 is added to the graph (FIG. 8). The placement regions for the sink latches 320 are updated to be the area 720. This process of obtaining region 720 as an update of the placement region 620, when applicable, is referred to as a reduced merging. Once the graph is formed, according to the criteria discussed above, a determination is made about which latches 320 to merge.

FIG. 8 shows exemplary overlapping placement regions 810 and the resulting exemplary connected graphs 800a-c according to embodiments. To be clear, this is still part of one level of the breadth first roots to leaves pass which is performed for one level of latches (across all trees 300) at a time. Also, the regions 810 are placement regions 620 or 720 (if reduced merging was required) as discussed above. The regions 810 are labeled with letters that correspond to the letters in the graphs 800a-c. As FIG. 8 indicates, region A 810, region B 810, and region C 810 all intersect with each other. This is reflected by the connections between all three regions 810 in the corresponding graph 800a. Regions E 810 and I 810 both intersect with region F 810 but not with each other. This is reflected in the graph 800b. Because edges are only added to the graph when merger conditions are met, the graph 800 alone may be used at this point to determine mergers among latches 320. Any known techniques may be applied to the graph 800 to find cliques such as those shown in the graphs 800a, 800c. A clique is a portion of an undirected graph 800 in which all vertices are connected to all other vertices. Thus, in graph 800b, possible cliques include (D, E, F), (E, F, G), (F, G, D), (G, D, E), and (F, I, K). Additionally, any pair of connected vertices are cliques (e.g., (D, E), (F, G)). Because latches 320 at each level are processed at a time, direct mergers are limited to be between latches 320 within the same level (of the same or different trees 300) or latches 320 of adjacent levels (a local source 605 with a sink latch 320). However, latches 320 from multiple consecutive levels may be merged together indirectly. For example, latches 320 from levels 3 and 4 may be merged and then the resulting merged latch 320 may be merged again with a latch 320 from level 5.

Figure 9:
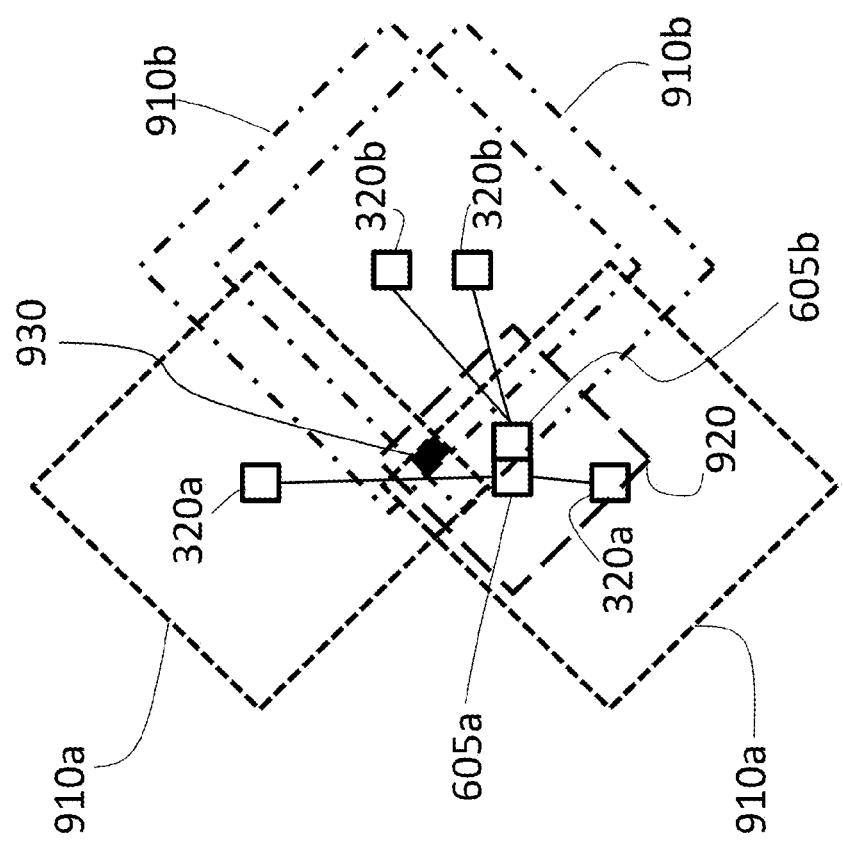
FIG. 9 illustrates a leaves to roots pass according to embodiments.

FIG. 9 illustrates a leaves to roots pass (block 240, FIG. 2) according to embodiments. The leaves to roots pass is used to update placement regions of parent latches 320 (local sources 605) to account for the shapes (420 or intersected placement region 620, 720) of the placement regions of the corresponding sink latches 320. The update ensures that parent latches 320 have restrictive enough placement shapes to ensure that constraints used in forming the shapes are not violated. In the leaves to roots pass, the placement region of each sink (latch 320 at the current level) associated with a local source 605 is found. Based on the discussion above, this placement region may be shape 420 or an intersection placement region 620, 720. A Manhattan expansion of this sink placement region, for each sink, by the local source 605 to sink distance limit is performed. Then these expanded shapes 910 are intersected with the local source 605 placement regions 920. Because latches 320 eligible for merger have already been identified, the intersection must be done with all of the latches 320 to be merged into the multi-bit latch. According to an embodiment, this is achieved by maintaining a single placement region (e.g., the intersection placement region 620, 720) for all the latches 320 identified as being eligible to be merged into a multi-bit latch. Because this process is performed from leaves (latches 320 at the level closest to the sinks 330) to roots (latches 320 at the level closest to the source 310), updates that are made on the levels closer to the leaves affect the levels closer to the roots. FIG. 9 shows expanded shapes 910a associated with two (sinks) latches 320a of local source 605a and expanded shapes 910b associated with two sink latches 320b of local source 605b. The potential merge placement region 920 of the local sources 605a, 605b (latches 320 identified for potential merger based on the roots to leaves pass (block 230)) is also shown. Based on an intersection of expanded shapes 910a, 910b and the potential merge placement region 920, the solid area is the resulting valid placement region 930 in which a multi-bit cell resulting from a merger of the local sources 605a, 605b may be placed. If no such area were identified (intersection result is an empty area), then the merger between the local sources 605a, 605b cannot be completed.

Figure 10:
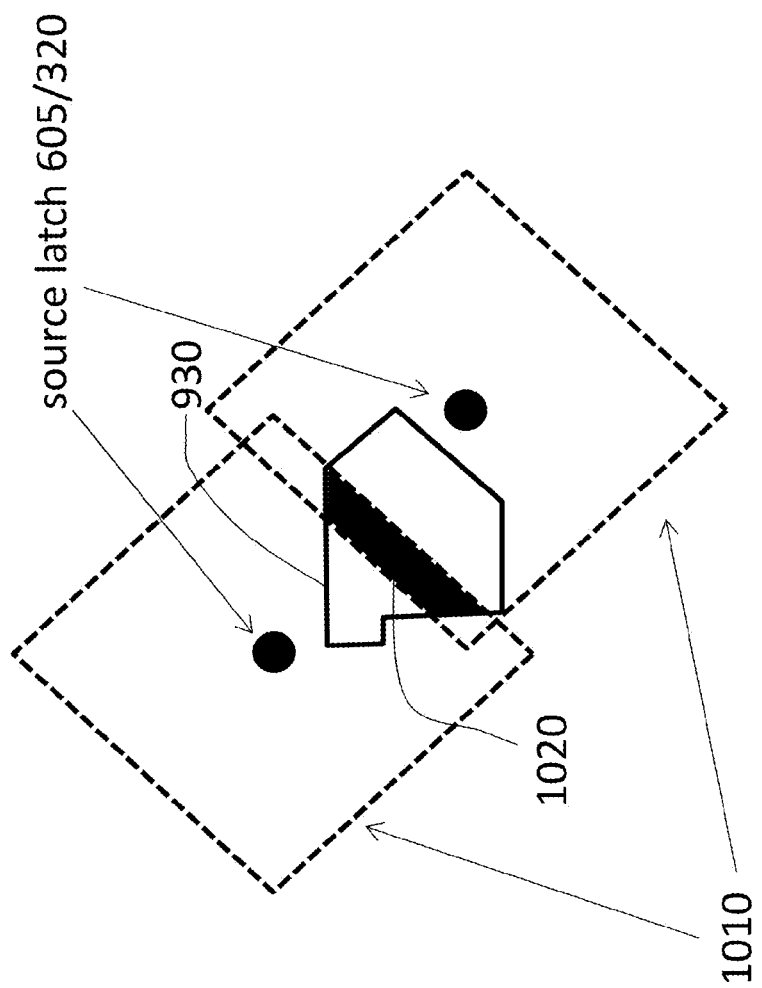
FIG. 10 illustrates a roots to leaves pass according to embodiments.

FIG. 10 illustrates a roots to leaves pass (block 250, FIG. 2) according to embodiments. Following the leaves to roots pass (block 240), all of the placement regions are updated. At this point the roots to leaves pass (block 250) is used to place all latches 320 (merged and unmerged). The roots to leaves pass at block 250 is similar to the initial roots to leaves pass at block 220 but the latches 320 that were merged into multi-bit latches need to be placed at a location within their region (930) that satisfies all the design constraints. According to one embodiment, a diamond 1010 is created again with a radius of the local source 605 (latch 320) to sink (latch 320) distance around the local source 605. The intersection of the diamond 1010 with the sink placement region 340, 930 results in an area 1020 within which any location should satisfy design constraints. FIG. 10 shows two diamonds 1010 corresponding to local sources 605 of two latches 320 to be merged into a multi-bit latch. As such the placement region of the latches 320 (the sinks) is 930 rather than 340. The area 1020 is the intersection of the diamonds 1010 of the two local sources 605 with the placement region 930 of the multi-bit latch resulting from merger of the two sink latches 320. Because a multi-bit latch may be on multiple trees 300 and the process (at block 250) is performed on multiple trees 300, once the multi-bit latch is placed (e.g., in placement area 930 in lieu of sources 605a, 605b in FIG. 9), the multi-bit latch may be skipped when encountered during processing of another tree 300. It is possible to perform multiple pairs of breadth first roots to leaves passes (at block 230) and leaves to roots passes (at block 240), as indicated by FIG. 2, to find additional mergers.

The result of the processes at blocks 210 through 250 is that the latches 320 are all placed and mergers are fully identified. Mergers based on processes 210 through 250 result in m-bit latches 320, where m may be any integer greater than one. However, the latches 320 must be mapped into a physical implementation of the chip. At block 260 (FIG. 2), the processes include converting the m-bit latches 320 into implementable cells. A library of cells for the chip may include latches 320 of bit widths 1, 2, 4, and 8, for example. The decision of which cells from the library should be used may depend on the power consumption associated with each. For example, two merged latches 320 may be put into a 2 bit cell from the library, three and four merged latches 320 may be implemented as a 4 bit cell from the library, five merged latches 320 may be implemented as a 4 bit cell and a 1 bit cell from the library, and six to eight merged latches 320 may be implemented as an 8 bit cell from the library. If, for example, eleven latches 320 were implemented as an 8 bit cell and a 4 bit cell, one bit of one of the cells would be unused.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method of merging storage elements on one or more multi-cycle signal distribution trees into multi-bit cells of an integrated circuit, the method comprising:
    determining, using a processor, initial placement regions and initial placement locations for a plurality of storage elements arranged in two or more levels on the one or more trees, the two or more levels of each of the one or more trees including a root level closest to a tree source of the respective one or more trees and a leaf level closest to a tree sink of the respective one or more trees;
    determining potential merge storage elements among the plurality of storage elements, the potential merge storage elements being eligible for merger; and
    merging one or more pairs of the potential merge storage elements across the one or more trees into the multi-bit cells based on satisfying an additional condition, wherein the additional condition is based on a source storage element among the plurality of storage elements for each potential merge storage element of the one or more pairs, and each source storage element corresponding with each potential merge storage element is arranged in a level among the two or more levels that is closer to the tree source than the potential merge storage element.

2. The computer-implemented method according to claim 1, wherein the satisfying the additional condition, for each pair of potential merge storage elements, includes the storage elements that are sources of each of the pair of potential merge storage elements being merged or includes the storage elements that are the sources of each of the pair of potential merge storage elements being within a predefined threshold distance of each other.

3. The computer-implemented method according to claim 1, wherein the satisfying the additional condition, for each pair of potential merge storage elements, includes determining whether a region associated with each of the sources of each of the pair of potential merge storage elements and the placement shapes of each of the pair of potential merge storage elements is non-empty.

4. The computer-implemented method according to claim 1, wherein the merging the one or more pairs of the potential merge storage elements includes building a connected graph based on the additional condition being satisfied and identifying cliques in the connected graph.

5. The computer-implemented method according to claim 1, wherein the determining the potential merge storage elements is based on processing one or more of the one or more trees, in parallel, one current level at a time, from the root level to the leaf level based on expanding the initial placement regions of the storage elements among the plurality of storage elements that are located at a level above the current level toward the tree source into expanded placement regions and intersecting the expanded placement regions with placement shapes obtained from the initial placement regions of the storage elements among the plurality of storage elements that are located at the current level, non-empty results of the intersecting indicating the potential merge storage elements.

6. The computer-implemented method according to claim 1, further comprising determining a merge placement region for each pair of potential merge storage elements based on an intersection of a region around the pair of potential merge storage elements with expanded regions around each source of the pair of potential merge storage elements, wherein the determining the merge placement region is performed one level at a time from the leaf level to the root level and the determining the potential merge storage elements and the determining the merge placement region is performed iteratively.

7. The computer-implemented method according to claim 1, further comprising determining a placement location for each merged and unmerged one of the plurality of storage elements based on an intersection of a final placement region of the merged or unmerged one of the plurality of storage elements with the initial placement region of the one or more sources associated with the merged or unmerged one of the plurality of storage elements.

8. The computer-implemented method according to claim 1, further comprising mapping the multi-bit cells into implementable multi-bit storage elements of one, two, four, or eight bits.

9. A system to merge storage elements on one or more multi-cycle signal distribution trees into multi-bit cells of an integrated circuit, the system comprising:
    a memory device configured to store initial placement regions and initial placement locations determined for a plurality of storage elements arranged in two or more levels on the one or more trees, the two or more levels of each of the one or more trees including a root level closest to a tree source of the respective one or more trees and a leaf level closest to a tree sink of the respective one or more trees; and
    a processor configured to determine potential merge storage elements among the plurality of storage elements, the potential merge storage elements being eligible for merger, and merge one or more pairs of the potential merge storage elements across the one or more trees into the multi-bit cells based on satisfying an additional condition, wherein the additional condition is based on a source storage element among the plurality of storage elements for each potential merge storage element of the one or more pairs, and each source storage element corresponding with each potential merge storage element is arranged in a level among the two or more levels that is closer to the tree source than the potential merge storage element.

10. The system according to claim 9, wherein the additional condition includes the storage elements that are sources of each of the pair of potential merge storage elements being merged, or includes the storage elements that are the sources of each of the pair of potential merge storage elements being within a predefined threshold distance of each other, or includes a region associated with each of the sources of each of the pair of potential merge storage elements and the placement shapes of each of the pair of potential merge storage elements being non-empty.

11. The system according to claim 9, wherein the processor merges the one or more pairs of the potential merge storage elements by building a connected graph based on the additional condition being satisfied and identifying cliques in the connected graph.

12. The system according to claim 9, wherein the processor determines the potential merge storage elements based on processing one or more of the one or more trees, in parallel, one current level at a time, from the root level to the leaf level based on expanding the initial placement regions of the storage elements among the plurality of storage elements that are located at a level above the current level toward the tree source into expanded placement regions and intersecting the expanded placement regions with placement shapes obtained from the initial placement regions of the storage elements among the plurality of storage elements that are located at the current level, non-empty results of the intersecting indicating the potential merge storage elements.

13. The system according to claim 9, wherein the processor determines a merge placement region for each pair of potential merge storage elements based on an intersection of a region around the pair of potential merge storage elements with expanded regions around each source of the pair of potential merge storage elements, and determines the merge placement region for one level at a time from the leaf level to the root level, and the processor determines the potential merge storage elements and the merge placement region iteratively.

14. The system according to claim 9, wherein the processor determines a placement location for each merged and unmerged one of the plurality of storage elements based on an intersection of a final placement region of the merged or unmerged one of the plurality of storage elements with the initial placement region of the one or more sources associated with the merged or unmerged one of the plurality of storage elements, and the system maps the multi-bit cells into implementable multi-bit storage elements of one, two, four, or eight bits.

15. A computer program product for merging storage elements on one or more multi-cycle signal distribution trees into multi-bit cells of an integrated circuit, the computer program product comprising a computer readable storage medium having program instructions embodied therewith, the program instructions executable by a processor to perform a method comprising:
determining initial placement regions and initial placement locations for a plurality of storage elements arranged in two or more levels on the one or more trees, the two or more levels of each of the one or more trees including a root level closest to a tree source of the respective one or more trees and a leaf level closest to a tree sink of the respective one or more trees;
determining potential merge storage elements among the plurality of storage elements, the potential merge storage elements being eligible for merger; and
merging one or more pairs of the potential merge storage elements across the one or more trees into the multi-bit cells based on satisfying an additional condition, wherein the additional condition is based on a source storage element among the plurality of storage elements for each potential merge storage element of the one or more pairs, and each source storage element corresponding with each potential merge storage element is arranged in a level among the two or more levels that is closer to the tree source than the potential merge storage element.

16. The computer program product according to claim 15, wherein the satisfying the additional condition, for each pair of potential merge storage elements, includes the storage elements that are sources of each of the pair of potential merge storage elements being merged, or includes the storage elements that are the sources of each of the pair of potential merge storage elements being within a predefined threshold distance of each other, or includes determining whether a region associated with each of the sources of each of the pair of potential merge storage elements and the placement shapes of each of the pair of potential merge storage elements is non-empty.

17. The computer program product according to claim 15, wherein the merging the one or more pairs of the potential merge storage elements includes building a connected graph based on the additional condition being satisfied and identifying cliques in the connected graph.

18. The computer program product according to claim 15, wherein the determining the potential merge storage elements is based on processing one or more of the one or more trees, in parallel, one current level at a time, from the root level to the leaf level based on expanding the initial placement regions of the storage elements among the plurality of storage elements that are located at a level above the current level toward the tree source into expanded placement regions and intersecting the expanded placement regions with placement shapes obtained from the initial placement regions of the storage elements among the plurality of storage elements that are located at the current level, non-empty results of the intersecting indicating the potential merge storage elements.

19. The computer program product according to claim 15, further comprising determining a merge placement region for each pair of potential merge storage elements based on an intersection of a region around the pair of potential merge storage elements with expanded regions around each source of the pair of potential merge storage elements, wherein the determining the merge placement region is performed one level at a time from the leaf level to the root level and the determining the potential merge storage elements and the determining the merge placement region is performed iteratively.

20. The computer program product according to claim 15, further comprising determining a placement location for each merged and unmerged one of the plurality of storage elements based on an intersection of a final placement region of the merged or unmerged one of the plurality of storage elements with the initial placement region of the one or more sources associated with the merged or unmerged one of the plurality of storage elements, and mapping the multi-bit cells into implementable multi-bit storage elements of one, two, four, or eight bits.

* * * * *